US006869229B2

(12) United States Patent
Reedy et al.

(10) Patent No.: US 6,869,229 B2
(45) Date of Patent: Mar. 22, 2005

(54) COUPLED OPTICAL AND OPTOELECTRONIC DEVICES, AND METHOD OF MAKING THE SAME

(75) Inventors: Ronald E. Reedy, San Diego, CA (US); James S. Cable, San Diego, CA (US); Charles B. Kuznia, Encinitas, CA (US); Donald J. Albares, San Diego, CA (US); Tri Q. Le, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 10/099,523

(22) Filed: Mar. 15, 2002

(65) Prior Publication Data

US 2002/0131727 A1 Sep. 19, 2002

Related U.S. Application Data

(60) Provisional application No. 60/276,377, filed on Mar. 16, 2001.

(51) Int. Cl.[7] .......................... G02B 6/42; G02B 6/30; G02B 6/12
(52) U.S. Cl. ........................ 385/88; 385/49; 385/14
(58) Field of Search ......................... 385/14, 49, 83, 385/88–94, 32, 36, 52, 120

(56) References Cited

U.S. PATENT DOCUMENTS

| 4,122,479 | A |   | 10/1978 | Sugawara et al. |
| 4,843,448 | A |   | 6/1989 | Garcia et al. |
| 5,027,171 | A |   | 6/1991 | Reedy et al. |
| 5,416,043 | A |   | 5/1995 | Burgener et al. |
| 5,492,857 | A |   | 2/1996 | Reedy et al. |
| 5,493,437 | A |   | 2/1996 | Lebby et al. ............... 359/152 |
| 5,550,380 | A | * | 8/1996 | Sugawara et al. ..... 250/370.11 |
| 5,572,040 | A |   | 11/1996 | Reedy et al. |

(List continued on next page.)

FOREIGN PATENT DOCUMENTS

| DE | 19931944 A1 | * | 1/2001 | ............ G02B/6/42 |
| JP | 2000009968 A | * | 1/2000 | ............ G02B/6/42 |
| WO | WO 00/60665 |   | 10/2000 | |

OTHER PUBLICATIONS

Louderback et al. "Flip–Chip Bonded Arrays of Monolithically Integrated, Microlensed Vertical–Cavity Lasers and Resonant Photodetectors." Ieee Photonics Technology Letters, Ieee Inc. New York, US, vol. 11, No. 3, Mar. 1999; pp. 304–306.

Lin, Chao–Kun, Student Member, IEEE, Ryu, Sang–Wan, Dapkus, P. Daniel 1999. High Performance Wafer–Gonded Bottom–Emitting 850–nm VCSEL's on Undoped GaP and Sapphire Substrates. IEEE Photonics Technology Letters vol. 11, No. 12, pp. 1542–1544.

Strzelecka. "VCSEL based modules for optical interconnects." Part of the SPIE Conference on Vertical–Cavity Surface–Emitting Lasers III. SPIE Vo. 3627.

(List continued on next page.)

Primary Examiner—John D. Lee
Assistant Examiner—Sarah U Song
(74) Attorney, Agent, or Firm—Yongzhi Yang; Steven J. Hultquist; Marianne Fuierer (57) ABSTRACT

An optical-optoelectronic coupling structure comprising a flip-chip optoelectronic/ultrathin silicon-on-sapphire device mounted on a V-groove, optical-fiber-bearing carrier substrate, including light-reflective structures for launching light into the optical fiber core or transmitting light emitted by the optical fiber core to the optoelectronic device. The optical fiber may be immobilized in the V-groove using a curable resin adhesive characterized by a refractive index substantially similar to the refractive index of the optical fiber.

33 Claims, 5 Drawing Sheets

U.S. PATENT DOCUMENTS

| | | | |
|---|---|---|---|
| 5,596,205 | A | 1/1997 | Reedy et al. |
| 5,600,169 | A | 2/1997 | Burgener et al. |
| 5,605,856 | A | 2/1997 | Goosen et al. |
| 5,663,570 | A | 9/1997 | Reedy et al. |
| 5,764,832 | A | 6/1998 | Tabuchi |
| 5,858,814 | A | 1/1999 | Goossen et al. |
| 5,861,336 | A | 1/1999 | Reedy et al. |
| 5,863,823 | A | 1/1999 | Burgener |
| 5,883,396 | A | 3/1999 | Reedy et al. |
| 5,895,957 | A | 4/1999 | Reedy et al. |
| 5,920,233 | A | 7/1999 | Denny |
| 5,923,951 | A | 7/1999 | Goossen et al. |
| 5,930,638 | A | 7/1999 | Reedy et al. |
| 5,973,363 | A | 10/1999 | Staab et al. |
| 5,973,382 | A | 10/1999 | Burgener et al. |
| 6,005,262 | A | 12/1999 | Cunningham et al. |
| 6,034,431 | A | 3/2000 | Goosen et al. |
| 6,057,555 | A | 5/2000 | Reedy et al. |
| 6,081,638 | A | 6/2000 | Zhou |
| 6,243,508 | B1 | 6/2001 | Jewell et al. |
| 6,257,772 | B1 * | 7/2001 | Nakanishi et al. ............ 385/89 |
| 6,389,202 | B1 | 5/2002 | Delpiano |
| 6,466,349 | B1 * | 10/2002 | Valley et al. ............... 398/182 |
| 6,504,977 | B1 * | 1/2003 | Krishnamoorthy ........... 385/49 |

OTHER PUBLICATIONS

Ahadian. "Practical OEIC's Based on the Monolithic Integration of GaAs–InGaP LED's with Commercial GaAs VLSI Electronics." IEEE Journal of Quantum Electronics, vol. 34, No. 7, Jul. 1998.

London. "Preparation of Silicon–on Gallium Arsenide Wafers for Monolithic Optoelectronic Integration." IEEE Photonics Technology Letters, vol. 11, No. 8, Aug. 1999.

Hu. "Multimode WDM Optical Data Links with Monolithically Integrated Multiple–Channel VCSEL and Photodetector Arrays." Journal of Quantum Electronics, vol. 34, No. 8, Aug. 1998.

Chen. "Collimating Diode Laser Beams from a Large–Area VCSEL–Array Using Microlens Array." IEEE Photonics Technology Letters, vol. 11, No. 5, May 1999.

Louderback. "Modulation and free–space link characteristics of monolithically integrated vertical–cavity lasers and photodetectors with microlenses." IEEE Journal of Selected Topics in Electronics, vol. 5, No. 2, Mar./Apr. 1999.

Yoo. "Experimental demonstration of a multihop shuffle network using WDM multiple–plane optical interconnection with VSCEL and MQW/DBR detector arrays." IEEE Photonics Technology Letters, vol. 10, No. 10, Oct. 1998.

Simonis. "Research on VCSEL interconnects and OE processing at Army Research Laboratory." Proc. SPIE 3946, paper #28.

* cited by examiner

COUPLED OPTICAL AND OPTOELECTRONIC DEVICES, AND METHOD OF MAKING THE SAME

This application claims priority as a continuation-in-part of U.S. Provisional Patent Application Ser. No. 60/276,377, filed Mar. 16, 2001, by the present inventors.

FIELD OF THE INVENTION

The present invention relates to a method and apparatus for coupling light between optical fibers and optoelectronic devices for optical signal processing. Optical/optoelectronic coupling structures of the invention may variously include light receivers, transmitters, and transceivers.

BACKGROUND OF THE INVENTION

Applications that require manipulation of many optical signals are becoming more complex and more commonplace. Such applications include the routing of signals in fiber optic networks, necessitated by, for example, telecommunications and large volumes of internet traffic. In fiber optic networks, large volumes of optical signals must be transmitted between optical fibers and optoelectronic devices; optical signals must be processed and retransmitted as electrical or optical signals; electrical signals must be processed and transmitted as optical signals. The optical fibers are typically present as arrays of up to 100×100 fibers; larger arrays are possible and may be expected in the near future. As optical interconnection networks become more complex and the volume of signal traffic increases, it becomes more and more important to reduce signal loss and cross-talk and to minimize the size of the optical/optoelectronic interconnect package. It would be desirable to intimately integrate electrical and optical signal processing, transmission and reception, in a single robust unit providing efficient optical coupling to optical fibers.

The optoelectronic devices that perform the optical signal processing tasks, such as lasers and photodetectors, are typically made in various optically active materials, such as compound semiconductors, most commonly III-V materials, especially GaAs, as well as II-VI semiconductors such as ZnSe, transparent ferroelectrics such as lithium niobate and other related oxide materials, and liquid crystal and other optoelectronic polymers. Optoelectronic devices may be fabricated in epitaxial layers grown on suitable substrates which are not ordinarily silicon. For example, vertical cavity surface emitting lasers (VCSELs) are typically fabricated in AlGaAs and GaAs on GaAs substrates. Optoelectronic devices may also be fabricated in single crystal materials such as oxides.

The electronic control circuitry for the optical/optoelectronic interconnect systems is typically formed in silicon. Silicon-based metal-oxide semiconductor (MOS) technology is virtually the standard for digital circuits that are used for to control the signal processing tasks in switching systems. Increasingly, CMOS (complementary MOS) technology is utilized in these applications. CMOS technology incorporates both n-channel MOS and p-channel MOS transistors in the same monolithic structure. No other approach can compare with the high device densities and high yields available with silicon CMOS technology.

It is necessary to find methods to combine high density, high speed CMOS circuitry with optoelectronic devices in an intimate fashion in order to minimize parasitic capacitance and inductance and to increase density of optical interconnects. Applications for such a capability include formation of transmitter, receiver or amplifier modules for optical fiber communication. Integrating the CMOS circuitry with the optoelectronic devices has the potential to greatly increase the efficiency of the overall optical/optoelectronic signal processing package.

In high speed telecommunications and data networks, such CMOS circuitry-controlled optoelectronic devices must efficiently transmit and receive optical signals to and from optical fibers. Optical fibers have an optical core that transmits light and an outer cladding layer that has a lower refractive index than the optical core. Optical fibers used in networks may be multi-mode or single mode, depending on the size of the optical core, and selected based on the distance over which the optical signal needs to be transmitted and the bandwidth desired. Optical fibers are formed from a variety of materials such as glasses and plastics, glasses being predominant. It is understood that the optical signals are transmitted in the optical core along the fiber's long axis, and at the fiber's end the signals are emitted and received by the optical fiber's optical core, though for shorthand convenience, signal transmission is sometimes said to be by "the optical fiber."

A desirable optical/optoelectronic coupling system will have high signal-to-noise ratio and high speed; low parasitic capacitance and inductance; high density; low crosstalk between devices; low power consumption; and the ability to integrate multiple functions. The resulting system will then have low cost and high performance.

A desirable optical/optoelectronic coupling system will have a reduced number of tightly specified or demanding manufacturing steps; will have fewer failure-susceptible parts such as wire bonds; and will generate a smaller amount of waste heat. Such devices must also meet multiple standards, such as a 250 $\mu$m pitch between each fiber; physical dimensions on the optical connections; and reliability characteristics including thermal cycling, humidity resistance and mechanical durability. An example of an optical fiber connector which is standardized is the "MT" ferrule, which precisely positions an array of optical fibers in a V-groove substrate and provides alignment means in the form of guide holes whose position relative to the fibers is tightly specified. The alignment means are used for alignment using complementary alignment members in the form of guide pins.

In some applications, space constraints dictate that the optical fibers must couple with optoelectronic devices whose primary direction of light access (light emission or reception) is at an angle to the direction that light is transmitted in an optical fiber core, e.g., typically approximately 90°. For example, in telecommunications networks, employing large numbers of lasers and detectors coupling to large numbers of optical fibers, there may be a limited amount of space between circuit boards arranged in stacks or there may be a strong incentive to have all coupling structures present a low profile to avoid impeding air flow that is desired to cool heat-producing devices. Further, if the optical fibers can be brought in along a mounting substrate (e.g., printed circuit board) on which the optoelectronic devices are mounted, to allow the optoelectronic devices to be situated as close as possible to other integrated circuitry, the distances that electrical signals must travel can be minimized. This consideration is especially important for maintaining electrical fidelity of the signal at high transmission rates, e.g. above a Gighertz. A desirable optical/optoelectronic coupling system will also provide efficient optical coupling between an optoelectronic device and an optical fiber in which the direction of light transmission in the optical fiber core is at an angle to the primary direction of light emission or absorption by the optoelectronic device.

A desirable optical/optoelectronic coupling system will also have the capability of enhancing transmission of light from the coupled optoelectronic device into the core of the optical fiber by permitting an optional light focusing step to take place prior to entry into the fiber. It should be noted that optical fibers are cylindrical, and hence if the surface of the fiber is allowed to act as a lens, it will be a spherical lens. At the size of an optical fiber, spherical aberration and chromatic aberration of spherical lenses are very disadvantageous. A preferred design approach will allow the inclusion of lenses designed to optimize optical coupling. Use of parabolic lenses and complex lenses offers the opportunity to reduce chromatic and spherical aberration. Lenses can also be designed which reduce alignment tolerances, thereby improving performance and lowering manufacturing costs.

A desirable optical/optoelectronic coupling system will be capable of processing optical signals between arrays of optoelectronic devices and arrays of optical fibers. Optical fibers are often provided in 1×12 arrays, although much larger one and two dimension fiber arrays are in development. The array sizes can be expected to grow as networks become more complex. Hence a useful coupling system will be configured to handle arrays in a simple and scalable fashion. Networks increase in both speed and number of connections in response to increasing data bandwidth demand, driven primarily by the growth of the Internet. As the network increases in size, the number of nodes increases exponentially, due to the requirements to make connections between multiple systems; to provide backup and storage functions; to provide redundant paths, and to allow flexible system operation.

The optical fiber arrays with which the optoelectronic devices must couple may advantageously be mounted in carriers such as "V-groove" substrates which have spaced-apart fiber-retaining V-grooves in their top surface. For the purposes of this specification, in relation to its associated optical fiber, a V-groove formed in a carrier substrate is a groove having two inwardly inclined planar surfaces for fiber alignment against each of which the curved surface of the associated optical fiber is able to make simultaneous line contact. The V-groove may be defined in its entirety by these planar fiber alignment surfaces meeting in a line at the base of the groove, or it may take a truncated form in which the two planar fiber alignment surfaces are connected by a third surface. Such V-grooves, truncated or otherwise, are grooves formed to provide precisely located and oriented planar fiber alignment surfaces using photolithographic techniques. Groove formation techniques may involve anisotropic etching of a crystalline substrate such as a single crystal silicon wafer (see, e.g., Bean, K. E., IEEE Transactions on Electron Devices, vol. ED-25, No. 10, October 1978, "Anisotropic Etching of Silicon," pp. 1185–1193); or it may involve injection molding of plastic components, which is well known in the semiconductor packaging industry.

U.S. Pat. No. 4,897,711, "Subassembly for Optoelectronic Devices," granted Jan. 30, 1990, describes methods of forming arrays of optical fibers mounted in V-groove substrates. Such v-groove optical fiber arrays have become well-known and accepted in optical network applications. Injection molded plastic components for mounting optical fibers, including V-groove substrates, are also well known, as for example those provided by Nissin Kasei Co., Ltd. (11-5 Senju-Kawaharacho, Adachi-ku, Tokyo 120-0037, Japan).

U.S. Pat. No. 4,730,198, granted Mar. 8, 1988, describes linear arrays of optical fibers aligned to linear arrays of optoelectronic devices on an elongated chip. The subassembly includes optical fiber segments embedded between V-groove mounting blocks and has the optoelectronic device array chip affixed to an end face of the blocks. The optoelectronic device array chip is therefore mounted orthogonally to the optical fiber blocks, and wire bonds are needed to provide an electrical connection to each optoelectronic device. Because the fiber mounting blocks are relatively thin, i.e. in the range of about 30 mils thick, the requirements of the electrical connection and the orthogonally mounted optoelectronic chip lead to a height mismatch and the need for a supporting member, which leads to added size, and with the wire bonds, added failure modes.

The anisotropic etching properties of silicon are also useful for aligning and mounting the optoelectronic devices. U.S. Pat. No. 4,897,711 describes packaging subassemblies for optoelectronic devices that align an optoelectronic device with various lenses, reflectors, and optical fiber transmission media. The supports for various optoelectronic devices and the reflecting surfaces are defined in monocrystalline silicon by taking advantage of known anisotropic etching properties of silicon. Because silicon etches preferentially along predictable crystallographic planes, various grooves, cavities and alignment detents can be quickly and easily made with great precision by masking and etching various surfaces of monocrystalline silicon support structures. The manufacturability of such optical/optoelectronic integrated modules is challenging, however, because of the need to etch very different profiles into the same silicon substrate, requiring many masking/demasking steps.

U.S. Pat. No. 5,243,671, granted Sep. 7, 1993, describes a method for coupling light from an edge-emitting laser chip into an optical fiber mounted in a substrate carrier having a V-groove etched therein. The fiber has a beveled end and is positioned in the plane of the laser chip (e.g., by being mounted on the same substrate) within the V-groove such that light emitted by the laser chip strikes the inner face of the beveled end and is totally internally reflected into the fiber core. The V-groove must provide an accurate vertical dimension so that the height of the fiber core can be precisely aligned with the laser output.

As was mentioned above, to accomplish the goal of an efficient optoelectronic/optical coupling method, it is first necessary to find methods to combine high density, high speed CMOS controlling circuitry with the associated optoelectronic devices in an intimate fashion in order to minimize parasitic capacitance and inductance and to increase density of optical interconnects. Various methods have been tried, with less than ideal results. Heteroepitaxial growth of GaAs on silicon, and silicon on GaAs have been explored, but after decades of research, fundamental problems such as the mismatch in the crystal lattice constants, cross-contamination, incompatibilities of device processing, and the difference in the coefficients of thermal expansion of the two materials have prevented this goal from being satisfactorily achieved, particularly when high performance lasers, photodetectors or drive electronics are required. Epoxy casting, by which completely fabricated chips are mounted in a common epoxy cast and final metal deposited (multichip modules) has numerous problems, including high cost and poor parasitics, size, reliability and yield. Flip-chip bonding, by which a chip is flipped over and attached to a substrate or other chip by a solder joint by which two dissimilar chips are brought into intimate electrical and mechanical contact with each other has been used for combining low temperature infrared (IR) detector arrays with silicon readout circuitry. There are commercial machines that can perform this operation with great reliability and repeatability. In this example, the silicon substrate is transparent to the infrared wavelengths being detected by the IR detector array. However, for optical wavelengths less than approximately 1 μm, silicon is too opaque for use as a transparent substrate, so this technique cannot be used and hence the substrate needs to be removed by etching or other means to provide optical access to the OE devices.

Furthermore, infrared detectors are generally low speed systems, often operating at Kilohertz speeds. For such low speeds, the parasitic effects of the silicon substrate are virtually non-existent. Optical communications systems operate at Gigahertz rates, or a million times higher in frequency. These high speeds cause the silicon substrate parasitics to become significant in areas of power consumption, crosstalk, distortion, maximum frequency and noise. These electrical limitations of silicon as a substrate material are true for all wavelengths of light being used. Therefore, even if the silicon is transparent at a given wavelength, it is not an ideal substrate for high speed (multi-Gigahertz) systems.

There is, therefore, a need for an improved commercially-viable method for coupling optical fibers to optoelectronic devices.

SUMMARY OF THE INVENTION

The present invention describes devices (and methods for making such devices) that provide optical-optoelectronic coupling and that overcome many of the disadvantages and shortcomings of previously described devices and methods. Furthermore, the present invention describes techniques which are readily manufacturable and that do not sacrifice the speed and power performance of either of the individual electronic or optoelectronic device components.

The challenges described above suggest that transparent, insulating substrate materials are advantageous for integration of optoelectronic and electronic capabilities. Of such transparent, insulating materials, oxides such as sapphire and spinel are particularly desirable substrate materials for integrated electronic-optoelectronic modules. Sapphire is transparent to a very wide range of optical wavelengths and possesses excellent optical homogeneity; its coefficient of thermal expansion closely matches that of GaAs; and it is an excellent electrical insulator and thermal conductor.

U.S. patent application Ser. No. 09/658,259, "Integrated Electronic-Optoelectronic Devices," was filed Sep. 8, 2000, by a common inventor of the present invention; the disclosure of this application is hereby incorporated herein by reference in its entirety. This application describes a method to integrate high density, high speed CMOS devices, which are formed in thin layers of silicon grown on transparent, insulating substrates, with optoelectronic devices by a technique of flip-chip bonding. The advantages of using a composite substrate comprising a monocrystalline semiconductor layer, such as silicon, epitaxially deposited on a supporting insulating substrate, such as sapphire, include the substantial reduction of parasitic capacitance between charged active regions and the substrate and the effective elimination of leakage currents flowing between adjacent active devices. This is accomplished by employing as the substrate an insulating material, such as sapphire ($Al_2O_3$), spinel, or other known highly insulating materials, and providing that the conduction path of any inter-device leakage current must pass through the substrate.

This new ability to form optoelectronic devices integrated with controlling CMOS circuitry on transparent, insulating substrates enables the opportunity to couple optical fibers to optoelectronic devices in new and advantageous configurations that take advantage of the substrate's optical transparency. The present invention discloses methods and structures to accomplish such coupling advantageously.

The present invention includes an optical-optoelectronic coupling structure and method for making the optical-optoelectronic coupling structure which combines optoelectronic devices (e.g. GaAs lasers, detectors, etc.), integrated with their controlling electrical circuitry (e.g. silicon CMOS devices and circuitry), with optical fibers in a manner which enables optical signals to be converted to electrical signals or vice versa with high signal-to-noise ratio and high speed; low parasitic capacitance and inductance; high density; low crosstalk between devices; low power consumption; and the ability to integrate multiple functions. The optical fibers useful in the practice of the invention may be single mode or multimode optical fibers.

The present invention provides an optical-optoelectronic coupling structure and method for fabricating the coupling structure. Examples of the invention include:

a structure for efficiently coupling light emitted by a vertical cavity surface emitting laser (VCSEL) into an optical fiber core for signal transmission;

a structure for coupling light emitted by an optical fiber core into the active area of a photodetector for signal reception;

a structure for coupling light emitted by an array of VCSELs into a corresponding array of optical fiber cores for signal transmission;

a structure for coupling light emitted by an array of optical fiber cores into the active areas of a corresponding array of photodetectors for signal reception; and a light transceiver comprising (i) a structure for coupling light emitted by a first array of optical fibers into the active areas of a corresponding array of photodetectors for signal reception; (ii) a structure for coupling light emitted by an array of VCSELs into a corresponding second array of optical fibers for signal transmission; (iii) a common transparent insulating substrate to which the array of photodetectors and the array of VCSELs are both flip-chip bonded; and (iv) CMOS electrical circuitry formed in a thin silicon layer on the transparent, insulating substrate and in electrical communication with the photodetectors and the VCSELs.

An optical-optoelectronic coupling structure of the invention employs an optoelectronic device electrically connected through flip-chip bonds to controlling CMOS circuitry formed in a thin silicon layer on selected areas of the top surface of a transparent, insulating substrate to which the optoelectronic device is flip-chip bonded; that is, an integrated "flip-chip optoelectronic/silicon-on-insulator module." The flip-chip optoelectronic/silicon-on-insulator module is mounted on an optical-fiber-bearing carrier such that an optical path is described between the optoelectronic device and the optical fiber core, passing through the transparent substrate. The optical-optoelectronic coupling structures enable transmission of light between an optoelectronic device and an optical fiber having its long axis oriented at an angle to the primary direction of light access by the optoelectronic device (i.e., the direction that light intended for transmission by the optical fiber is emitted by a light emitting optoelectronic device such as a laser or a light-emitting diode; or the direction that light intended for reception or absorption by a light receiving optoelectronic device such as a photodetector or a light modulator is emitted by an optical fiber). This angle is typically approximately normal or orthogonal (90°), but the invention is not limited to orthogonal angles; the angle may vary somewhat, e.g., +/−30° if the physical constraints of particular application so require. To accomplish optical coupling, the optical-optoelectronic coupling structures of the invention are provided with a light-reflective angled structure, such as a light-reflective angled surface, a fiber image guide, or other suitable light-angling means.

The optical-optoelectronic coupling structure of the invention comprises:

a flip-chip optoelectronic/silicon-on-insulator module attached via the bottom surface of its transparent, insulating substrate to an optical fiber carrier which carries an optical fiber oriented with the long axis of the optical fiber at an angle to the primary direction of light emission or absorption by the optoelectronic device; and a light-reflective angled structure by means of which an optical path is described between the optoelectronic device and the optical fiber; the optical path passes through the transparent insulating substrate.

In one embodiment, the optical-optoelectronic coupling structure includes an optical fiber that has a light-reflective beveled end positioned within the optical fiber carrier such that an optical path is described between the optoelectronic device and the optical fiber core by way of the light-reflective beveled end surface. The fiber is positioned in such a manner that light emitted by the optoelectronic device passes through the transparent substrate, impinges on the optical fiber, and is reflected and launched by the beveled end of the fiber into the fiber core; or light emitted by the fiber core is reflected by the beveled end of the fiber, is transmitted out of the fiber and through the transparent substrate, and impinges on the active area of the optoelectronic device. The light-reflective beveled end surface of the optical fiber is optionally coated with a light-reflective material such as a metallic film or mirror, for example an aluminum coating, or the beveled end surface itself may be sufficiently reflective to reflect sufficient light for the purpose intended.

In another embodiment, the optical-optoelectronic coupling structure includes a V-groove, optical-fiber-bearing carrier that is provided with a light-reflective beveled interior surface which is angled to reflect light such that an optical path is described between the optoelectronic device and the optical fiber core, through the transparent substrate and by way of the light-reflective beveled interior surface. The optical fiber carrier is positioned relative to the optoelectronic device such that light emitted by the optoelectronic device passes through the transparent substrate, impinges on the optical fiber, and is reflected and launched by the beveled interior surface of the carrier into the fiber core; or light emitted by the fiber core is reflected by the beveled interior surface of the carrier, transmitted out of the fiber and through the transparent substrate, and impinges on the active area of the optoelectronic device. The light-reflective beveled interior surface of the optical fiber carrier is optionally coated with a light-reflective material such as a metallic film or mirror, for example an aluminum coating, or the beveled interior surface itself may be sufficiently reflective to reflect sufficient light for the purpose intended.

In yet another embodiment, the optical-optoelectronic coupling structure includes a fiber image guide, polished on two surfaces cut a selected angle to each other, and mounted between the optical fiber and the transparent insulating substrate. The fiber image guide is mounted such that one polished surface is normal to the primary direction of light emission or absorption by the optoelectronic device and is substantially parallel to the bottom surface of the transparent insulating substrate, and the other polished surface is normal to the primary direction of light emission or absorption by the optical fiber core and is substantially parallel to the end surface of the optical fiber. The fiber image guide reflects light internally to define an optical pathway between the optoelectronic device and the optical fiber core.

In another aspect, the invention provides an optical-optoelectronic coupling structure for coupling arrays of optoelectronic devices flip-chip bonded to a common transparent insulating substrate to corresponding arrays of optical fibers. The optical-optoelectronic coupling structures comprise:

(i) a flip-chip optoelectronic/silicon-on-insulator module comprising two or more optoelectronic devices flip-chip bonded in a spaced-apart arrangement to a top surface of a transparent insulating substrate;

(ii) an optical fiber carrier which carries two or more optical fibers in a corresponding spaced-apart arrangement;

wherein the flip-chip optoelectronic/silicon-on-insulator module is bonded via a bottom surface of its transparent, insulating substrate to the optical fiber carrier; and wherein the optical fibers have long axes which form an angle to a primary direction of light that is emitted or absorbed by the optoelectronic devices; and (iii) light-reflective angled structures by means of which optical paths are described between optoelectronic devices and corresponding optical fibers, wherein the optical paths pass through the transparent insulating substrate.

In preferred embodiments, the optical fiber(s) are immobilized in a V-groove carrier using a curable resin adhesive characterized by a refractive index substantially similar to the refractive index of the outer cladding layer of the optical fiber, allowing light to be transmitted into and out of the fiber core with very little lost to reflectance at the interface.

Lens structures may optionally be provided between the optical fiber(s) and the optoelectronic device(s) to optimize light transmission between them. Such lens structures may be fabricated in the transparent insulating substrate surface or may comprise polymeric microlenses, microlens arrays, and the like.

The electrical circuits in silicon preferably comprise CMOS devices. Especially preferred CMOS devices include VCSEL drivers, receiver circuits for photodetectors, and other signal/data processing and switching circuits.

Preferred optoelectronic devices are light-emitting devices such as lasers and diodes, light detecting devices such as photodetectors, and light modulators, such as quantum well modulators. Preferred light emitting optoelectronic devices are fabricated in III-V materials; and preferred light detecting devices are fabricated in III-V, IV and II-VI materials. For infrared and visible light, especially preferred light emitting devices are fabricated on GaAs substrates, and light detecting devices are fabricated in GaAs, InGaAs, Si, or Ge. In the practice of the present invention, it is an advantage that optoelectronic devices of more than one type of material may be incorporated into the hybrid module. For example, an advantageous combination comprises a II-VI based photodetector input, fabricated for example in HgCdTe, as input, in combination with a III-V based VCSEL output, fabricated for example in GaAs.

It is a further objective of the invention to provide a method for fabricating the optical-optoelectronic coupling structures. The method of the invention comprises the steps of:

bonding a flip-chip optoelectronic/silicon-on-insulator module, comprising an optoelectronic device flip-chip bonded to a top surface of a transparent insulating substrate, via a bottom surface of its transparent, insulating substrate, to an optical fiber carrier which carries an optical fiber having a long axis which forms an angle to a primary direction of light that is emitted or absorbed by the optoelectronic device; and providing a light-reflective angled structure by means of which an optical path is described between the optoelectronic device and the optical fiber, wherein the optical path passes through the transparent insulating substrate.

In preferred embodiments, the flip-chip optoelectronic/silicon-on-insulator module comprises a flip-chip optoelectronic/ultrathin silicon-on-sapphire module. The light-reflective angled structure may be selected from a light-reflective angled surface, a fiber image guide, or other suitable light-angling means.

In one embodiment, the method for making an optical-optoelectronic coupling structure comprises the steps of:

attaching a flip-chip optoelectronic/silicon-on-insulator module comprising an optoelectronic device flip-chip bonded to a top surface of a transparent insulating substrate, via a bottom surface of the transparent, insulating substrate, to an optical fiber carrier which retains an optical fibers having a long axis which forms an angle to the primary direction of light emission or absorption by the optoelectronic devices; and providing a light-reflective angled structure by means of which an optical path is described between the optoelectronic device and the optical fiber, wherein the optical path passes through the transparent substrate.

An example of the method for making an optical-optoelectronic coupling structure further includes (a) forming a reflective beveled end-surface on the optical fiber; and (b) positioning the optical fiber within the V-groove such that light emitted by the optoelectronic device impinges on a reflective beveled end-surface of the fiber and is reflected into the fiber core; or light transmitted by the fiber core is reflected by a reflective beveled end-surface of the fiber and impinges on the optoelectronic device.

Another example of the method further includes (a) forming in the V-groove, optical-fiber-bearing carrier a light-reflective beveled interior surface, angled (i) to reflect light impinging on the beveled interior surface into the optical fiber core or (ii) to reflect light emitted from the optical fiber core in a direction generally out of the fiber carrier; and (b) positioning the optical fiber carrier such that (i) light emitted by the optoelectronic device passes through the transparent substrate, impinges on the beveled interior surface of the fiber carrier, and is reflected and launched into the fiber core; or (ii) light emitted by the fiber core is reflected by the beveled interior surface of the carrier, transmitted through the transparent substrate, and impinges on the active area of the optoelectronic device. The light-reflective beveled interior surface of the optical fiber carrier is optionally coated with a light-reflective material a light-reflective material such as a metallic film or mirror, for example an aluminum coating, or the beveled interior surface itself may be sufficiently reflective to reflect sufficient light for the purpose intended.

In another embodiment, the method for fabricating optical-optoelectronic coupling structures comprises the steps of:

attaching a flip-chip optoelectronic/silicon-on-insulator module, via the bottom surface of its transparent, insulating substrate, to an optical fiber having a long axis that forms an angle to the primary direction of light emission or absorption by the optoelectronic device; and mounting a fiber image guide, polished on two surfaces cut at an appropriate angle to each other, between the optical fiber and the transparent insulating substrate such that one polished surface is normal to the primary direction of light emission or absorption by the optoelectronic device and is substantially parallel to the bottom surface of the transparent insulating substrate, and the other polished surface is normal to the primary direction of light emission or absorption by the optical fiber. The fiber image guide reflects light internally to define an optical pathway between the optoelectronic device and the optical fiber core. The optical fiber may be immobilized in a carrier such as a V-groove carrier, and the flip-chip optoelectronic/silicon-on-insulator module may be attached to the carrier.

In some embodiments, the method for making an optical-optoelectronic coupling structure further comprises immobilizing the optical fiber in a V-groove carrier using a curable resin adhesive characterized by a refractive index substantially similar to the refractive index of the outer cladding layer of the optical fiber, allowing light to be transmitted into and out of the fiber core with very little lost to reflectance at the interface.

In some embodiments, the method for making an optical-optoelectronic coupling structure further comprises providing lens structures between the optical fiber and the optoelectronic device to optimize light transmission between them. Such lens structures may be fabricated in the transparent insulating substrate surface or may comprise polymeric microlenses and the like.

In another aspect, the invention comprises a method of forming an optical-optoelectronic coupling structure for coupling arrays of optoelectronic devices to arrays of optical fibers. The method for forming the optical-optoelectronic coupling structure comprises the steps of:

attaching a flip-chip optoelectronic/silicon-on-insulator module comprising two or more optoelectronic devices flip-chip bonded to a top surface of a transparent insulating substrate in a spaced-apart arrangement, via a bottom surface of the transparent, insulating substrate, to an optical fiber carrier which retains two or more optical fibers in a corresponding spaced-apart arrangement, each of said fibers having a long axis which forms an angle to the primary direction of light emission or absorption by the optoelectronic devices; and providing a light-reflective angled structure by means of which optical paths are described between the optoelectronic devices and the corresponding optical fibers, wherein said paths pass through the transparent insulating substrate.

These and other desirable characteristics are embodied in the present invention and will become apparent through reference to the following detailed description of the invention and accompanying drawings.

BRIEF DESCRIPTION OF THE DRAWINGS

FIG. 1 is a schematic representation of an exemplary optical/optoelectronic coupling structure of the invention, wherein the optoelectronic device is a light-emitting device, showing the optical fiber end-on.

FIG. 2 is a schematic representation of the optical/optoelectronic coupling structure of FIG. 1, showing the optical fiber side-on.

FIG. 4 is a schematic representation of an array of optical/optoelectronic coupling structures of the invention, each as in FIG. 1 or FIG. 3, showing the optical fibers end-on.

FIG. 5 is a schematic representation of an embodiment of the optical/optoelectronic coupling structure of the invention, wherein the optoelectronic device is a light receiving device, showing the optical fiber end-on.

FIG. 6 is a schematic representation of the optical/optoelectronic coupling structure of FIG. 5, showing the optical fiber side-on.

DETAILED DESCRIPTION AND PREFERRED EMBODIMENTS

Integration of silicon and optoelectronic devices on a common insulating transparent substrate requires that an effective method for forming silicon CMOS devices on the transparent, insulating substrate be used. It has been found that high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950° C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"); the disclosures of which are incorporated by reference herein in their entirety.

As used herein, the following terms are defined as follows:

"Ultrathin silicon-on-insulator" or "ultrathin SOI" refers to composite substrates comprising high quality thin films of silicon on single crystal transparent, insulating substrates, such as sapphire or spinel. "Ultrathin silicon-on-sapphire" or "UTSi" refers to composite substrates comprising high quality thin films of silicon on single crystal sapphire. These composite substrates are prepared and processed by the methods described in previously referenced U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555; the disclosures of each of which were incorporated by reference herein in their entirety. Typically, the "ultrathin" silicon films are characterized by thickness less than approximately 150 nm. By the methods described in the patents listed above, electronic devices can be formed in an extremely thin layer of silicon on a transparent, insulating substrate, such as a synthetic sapphire wafer. This "ultrathin" silicon layer maximizes the advantages of the insulating substrate and allows the integration of multiple functions on a single chip. Traditional transistor isolation wells required for thick silicon are unnecessary, simplifying transistor processing and increasing circuit density.

In the practice of the invention, optoelectronic devices that are integrated with CMOS circuitry based in ultrathin silicon-on-insulator include all such devices that manipulate light, including but not limited to light-emitting diodes, lasers, photodetectors, and modulators. Such modules, comprising optoelectronic devices and CMOS circuitry integrated by the methods summarized above and disclosed in U.S. patent application Ser. No. 09/658,259, filed Sep. 8, 2000, entitled "Integrated Electronic-Optoelectronic Devices," previously cited and incorporated by reference, are herein referred to as "flip-chip optoelectronic/silicon-on-insulator modules," or "flip-chip optoelectronic/ultrathin silicon-on-sapphire modules" when the transparent insulating substrate is sapphire.

"CMOS devices" refers to Complementary Metal Oxide Semiconductor devices such as MOSFETs which are fabricated in silicon. Silicon-based CMOS technology is capable of achieving an extremely high density of devices in consistently high yields.

"Optoelectronic devices" refers to devices that detect, emit, modulate, or manipulate light. In the context of the present invention, such optoelectronic devices are fabricated in optically active materials that are selected to be optimal for the desired application, for example, III-V compound semiconductors, and typically detect, modulate or emit light. Optoelectronic devices may be fabricated using epitaxial layers on suitable substrates, for example, GaAs or InGaAs, or may be monolithic. Exemplary optoelectronic devices include but are not limited to surface-emitting lasers, light-emitting diodes, photodetectors, and light modulators.

"Bonding pads" as used herein refers to regions of conductive material formed in a predetermined pattern on the surface of an electronic or an optoelectronic device, in electrical communication with the device. The conductive material is selected to be suitable for flip-chip bonding, according to criteria well known in the microelectronic fabrication art, (e.g., K. W. Goossen et al., *IEEE Photonics Technol. Lett.*, Vol. 5(7), pp. 776–778, 1994; more recently Pu et al., *J. Selected Topics Quantum Electronics*, Vol. 5, No. 2, pp. 201–207, 1999). The bonding pads may be used directly for the flip-chip bonding step, where they are placed in physical contact and exposed to heat and/or pressure, whereupon they fuse to form an electrically conductive physical bond. Alternatively, the bonding pads may be provided with a "solder bump," a material selected to fuse upon exposure to heat and/or pressure to provide an electrically conductive physical bond between the two bonding pads.

"V-groove substrates" are substrates bearing at least one groove having two inwardly inclined planar surfaces suitable for optical fiber alignment against each of which the curved surface of an associated optical fiber is able to make simultaneous line contact. The V-groove may be defined in its entirety by these planar fiber alignment surfaces meeting in a line at the base of the groove, or it may take a truncated form in which the two planar fiber alignment surfaces are connected by a third surface. Such V-grooves, truncated or otherwise, are grooves formed to provide precisely located and oriented planar fiber alignment surfaces using photolithographic techniques. Groove formation may involve the anisotropic etching of a crystalline substrate such as a single crystal silicon wafer (see, e.g., Bean, K. E., IEEE Transactions on Electron Devices, vol. ED-25, No. 10, October 1978, "Anisotropic Etching of Silicon," pp. 1185–1193); or it may involve injection molding of plastic components which is well known in the semiconductor packaging industry. The optical fiber is laid in the groove in a line which is parallel to the plane defined by the surface of the V-groove substrate.

Techniques for packaging the optoelectronic device are known (e.g., I. P. Hall, "Non-hermetic Encapsulation and Assembly Techniques for Optoelectronic Applications" 10$^{th}$ European Microelectronics Conference, May 14–17, 1995, Copenhagen). Many lasers and photodetectors are commercially available, singly or in the form of arrays.

Integrated electronic/optoelectronic modules useful in the practice of the invention may be fabricated by methods described in U.S. patent application Ser. No. 09/658,259, the disclosure of which has been incorporated by reference. For example, a flip-chip optoelectronic/ultrathin silicon-on-insulator module may be fabricated by the steps of:

provffing a composite substrate comprising a thin layer of silicon on the top surface of a transparent, insulating substrate that has substantially parallel top and bottom surfaces;

fabricating one or more electronic circuits in the silicon layer, using well-known micro-fabrication techniques, each in electrical communication with one or more bonding pads formed in a pre-determined spaced-apart pattern;

forming one or more optically transparent areas in the silicon film correspondingly adjacent to the one or more electronic circuits;

polishing the backside of the transparent, insulating wafer and dicing the composite substrate bearing the electronic devices, the optically transparent areas, and the bonding pads to yield individual composite die, each of which bears one or more electronic device(s), optically transparent area(s), and bonding pads in a pre-determined spaced-apart pattern in electrical communication with the electronic device;

and providing an optoelectronic die comprising one or more optoelectronic devices formed on a suitable substrate including one or more bonding pads in a pre-determined spaced-apart pattern, each in electrical communication with one or more optoelectronic devices;

and combining an individual composite substrate die with an optoelectronic die through their respective bonding pads by the technique of flip-chip bonding, to thereby yield an integrated electronic-optoelectronic module.

In preferred embodiments, the transparent, insulating substrate is sapphire. Advantages provided by such electronic-optoelectronic modules include:

1. The electrically insulating nature of the sapphire substrate reduces or eliminates electrical parasitic effects which otherwise would limit high speed operation, e.g. high frequency signal transmission.
2. Optical transparency of the sapphire substrate allows easy optical access.
3. Thermal properties of sapphire dissipate heat from the electronic and optoelectronic devices efficiently. Good thermal diffusivity avoids hot spots.
4. Sapphire is very well matched to the common optoelectronic substrate GaAs in thermal coefficient of expansion. This thermal match makes hybrid device combinations very robust.
5. Good dielectric properties of sapphire reduce or eliminate substrate coupling and substrate loading effects in the electronic circuits.
6. Physically small size, because flip-chip bonding reduces number of individual separate device structures, which would have been connected by bonding wires.
7. Reliability is improved, since flip-chip solder bonds are less prone to failure than bond wires, whose connection to substrate is one of the most physically fragile points of an IC module.
8. Cost and yield are improved, because the CMOS circuitry and the optoelectronic devices can be fabricated in arrays for bonding.

In the figures described below, similar numerals refer to similar structures within each figure. The figures are generally illustrative and are not shown in exact scale or proportion. While a figure may depict an embodiment using a certain type of optoelectronic device, such as a light-emitting device, e.g., a VCSEL, it will be readily understood that the invention could similarly be embodied using other types of optoelectronic device, such as a light-receiving device, e.g. a photodetector.

Figure 1:
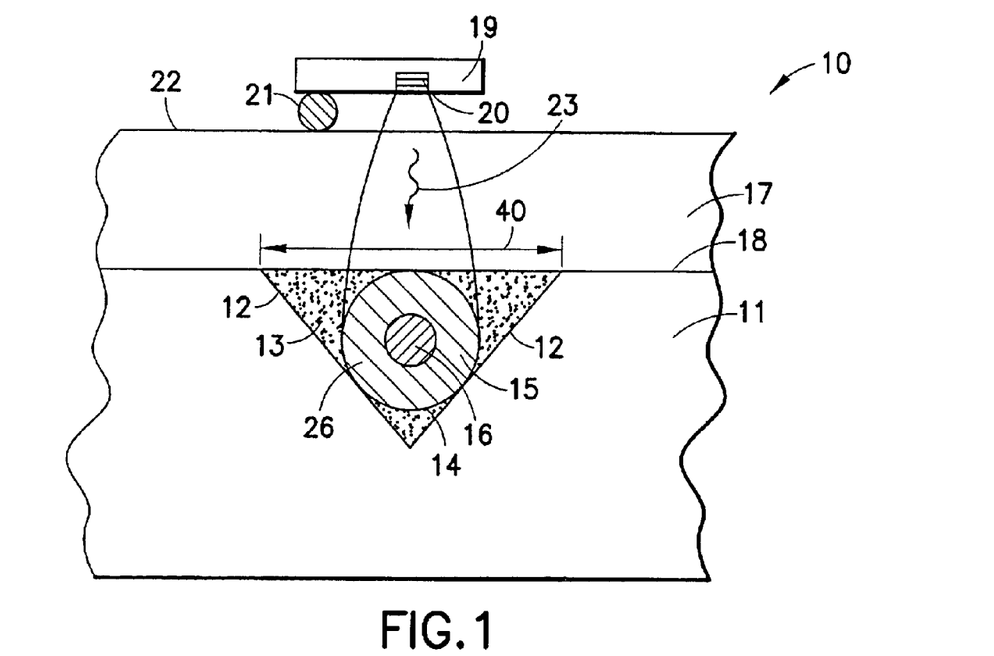
Figure 2:
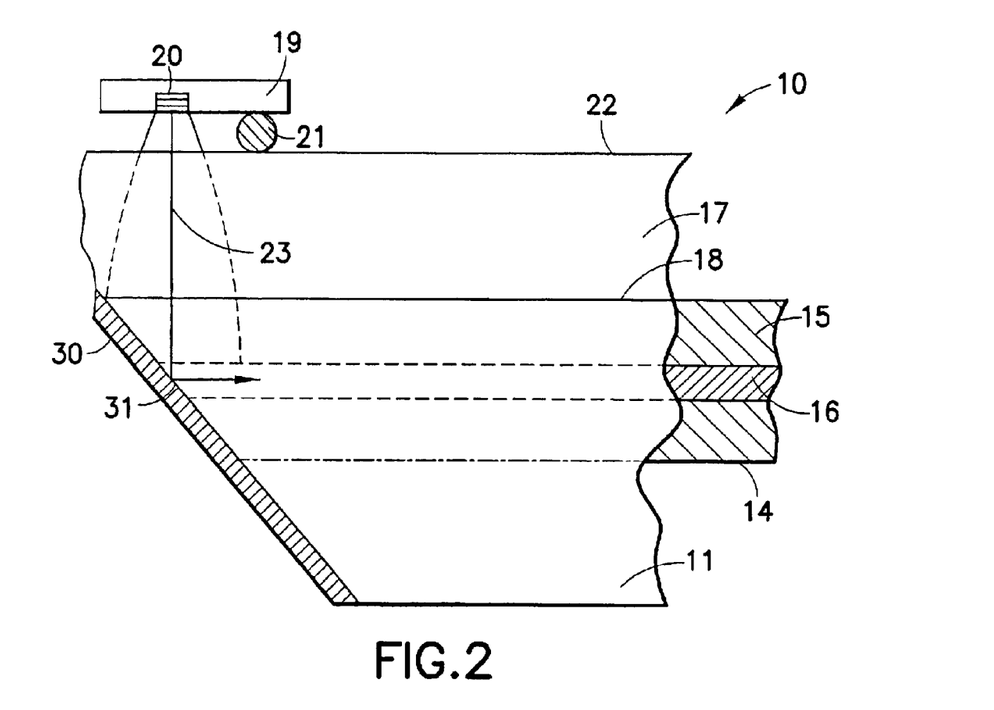

FIG. 1 (end-on) and FIG. 2 (side-on) are schematic representations of an optical/optoelectronic coupling structure 10 of the invention, wherein the optoelectronic device is a light-emitting device, showing the optical fiber end-on. Surface-emitting laser 20 is fabricated in suitable substrate 19 and is in electrical connection with bump-bond 21, which is in turn in electrical contact with CMOS circuitry in a thin silicon layer (not shown) formed on top surface 22 of transparent, insulating substrate 17, which has a bottom surface 18. Surface 18 is bonded to V-groove carrier substrate 11, which has a V-groove of width dimension 40 and inner surfaces 12 suited to receive an optical fiber 15. The optical fiber 15 has core 16, cladding layer 26, and outer surface 14. The fiber may be a single mode or a multi-mode fiber. The fiber is immobilized in the V-groove by an adhesive which wholly or partially fills area 13 around the fiber. The optical fiber is positioned in the V-groove so that light emitted from optoelectronic device 20 is transmitted through the transparent substrate 17, in the pathway indicated by 23, and impinges on the optical fiber core 16 and is reflected into it at beveled end 31 of the optical fiber core 16. Beveled end 31 is optionally provided with reflective coating 30 deposited on the beveled end 31 of the optical fiber core 16. For simplicity, the optical fiber and V-groove carrier substrate are shown with a common beveled end. Although this configuration is straightforward to form and manufacture by methods known in the art, e.g., by grinding, the only part of the structure that is required to have a beveled end is the optical fiber core 16. Light reflective materials suitable for use in optional layer 30 are well-known in the art, for example a metallic film or mirror, e.g., an aluminum coating. Aluminum is preferred.

As FIG. 2 makes clear, the light emitted by laser 20 passes through not only the transparent sapphire substrate 11 but also some areas of the adhesive 13 and the outer cladding layer 26 before it reaches beveled end 31, thence to be launched into the fiber core 16. It is very desirable to minimize light losses caused by reflection or absorption at interfaces, such as the interface between the adhesive and the optical fiber's outer layer. To accomplish this objective, the adhesive used to immobilize the fiber may be selected to have a refractive index substantially similar to that of fiber 15, meaning it should be within +/−15% of the refractive index of the fiber, at the temperatures of use. In addition to matching refractive index, desirable adhesives will resist degradation by heat applied in subsequent assembly steps; show very small or no changes in refractive index over time, since the finished parts must have a long working lifetime; and have good workability and defoaming properties.

Adhesives having controllably variable refractive index, suitable for use in optical systems are known. See, for example, U.S. Pat. No. 4,591,627, issued May 27, 1986, and U.S. Pat. No. 4,637,939, issued Jan. 30, 1987, (both entitled "Optical Adhesive Composition"), the disclosures of which are hereby incorporated herein in their entirety. These patents teach adhesives formulations suitable to control the refractive index in the range 1.415 to 1.570. Thus the commonly used types of optical fiber can be readily matched. For example, BK7 borosilicate crown glass, which is composed mainly of $SiO_2$, $Ba_2O_3$, $Na_2O$, and $K_2O$, has refractive index $\eta_D^{23}$=1.5164. Quartz has refractive index $\eta_D^{23} \cong 1.46$. $KZF_2$ glass, antimony flint glass composed mainly of $SiO_2$, $Ba_2O_3$, $Na_2O$, and $Sb_2O_3$, has refractive index $\eta_D^{23}$=1.5294.

Epoxy resins are especially suitable for this application. The refractive index may be matched to the optical glass fiber; other desirable properties include low optical losses, high adhesive strengths, high flexibility, and good heat-resisting properties. Low curing temperatures may be used, dependent on the resin components and the curing agents employed. Suitable resins are available from many suppliers, e.g. Epoxy Technology (Billerica, Mass.).

Figure 3:
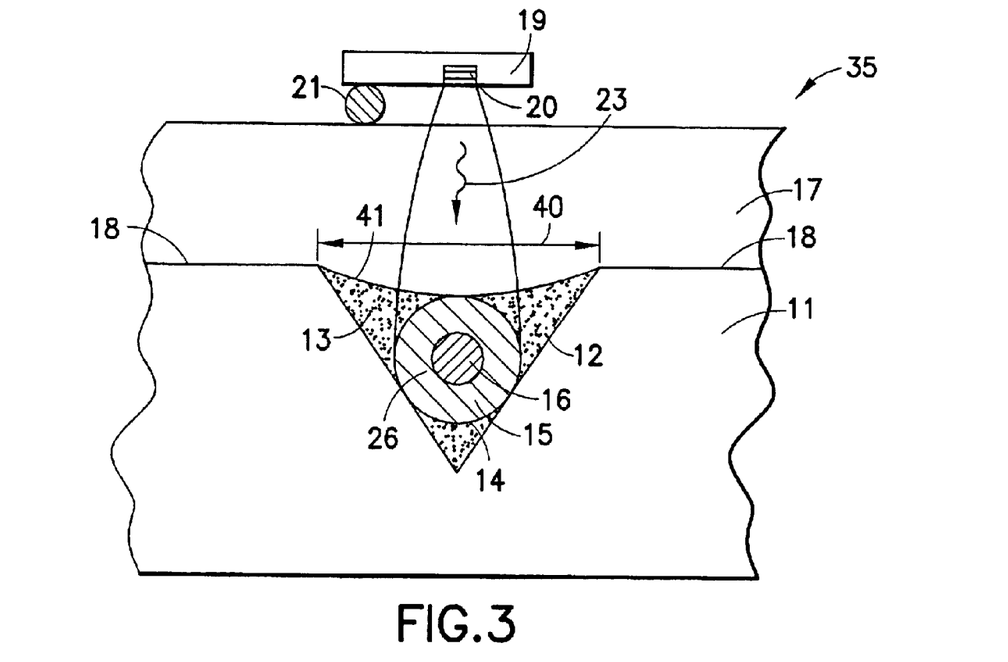
FIG. 3 is a schematic representation of an embodiment of the optical/optoelectronic coupling structure of the invention, including a parabolic lens incorporated in the transparent insulating substrate.

FIG. 3 is an end-on schematic representation of an optical/optoelectronic coupling structure 35 of the invention, similar to that shown in FIGS. 1 and 2, showing an embodiment with a parabolic lens 41 incorporated in the surface of the insulating substrate. The lens aids in focusing light emitted by the optoelectronic device efficiently into the optical fiber core. Such lenses are manufactured in the CMOS fabrication facility using well known techniques such as resist erosion with reflowed resists or gray scale resists. In either case, the in-plane dimensions of the lens are defined using standard photolithographic techniques. By reflowing the resist with high temperature or by using a gray-scale resist (for which the resist thickness is proportional to the light intensity) a height profile is patterned into the resist. Etching conditions are chosen such that the resist erodes at a known rate with respect to the etching rate of the underlying substrate material (either sapphire or silicon dioxide, typically). This creates a lens structure in the underlying layer, as shown in FIG. 3. Alternatively, a lens may be provided in the form of a microlens, interposed between the transparent insulating substrate and the fiber carrier. Suitable microlenses and microlens arrays are commercially available in both standard "off the shelf" and custom configurations (e.g., Corning Precision Lens, Cincinnati, Ohio; MEMS Optical Inc., Huntsville, Ala.; Thermo Oriel, Stratford, Conn.). Lenses can be obtained that are suitable for focusing (for single mode fibers) or collimating (for multimode fibers) the light beam. In another approach, microlenses can be formed by deposition of $Al_2O_3$ on sapphire ("Binary optics thin film microlens array," Motamedi, M. E. et al., SPIE Proc. (1993) vol. 1751, p.22–32).

Figure 4:
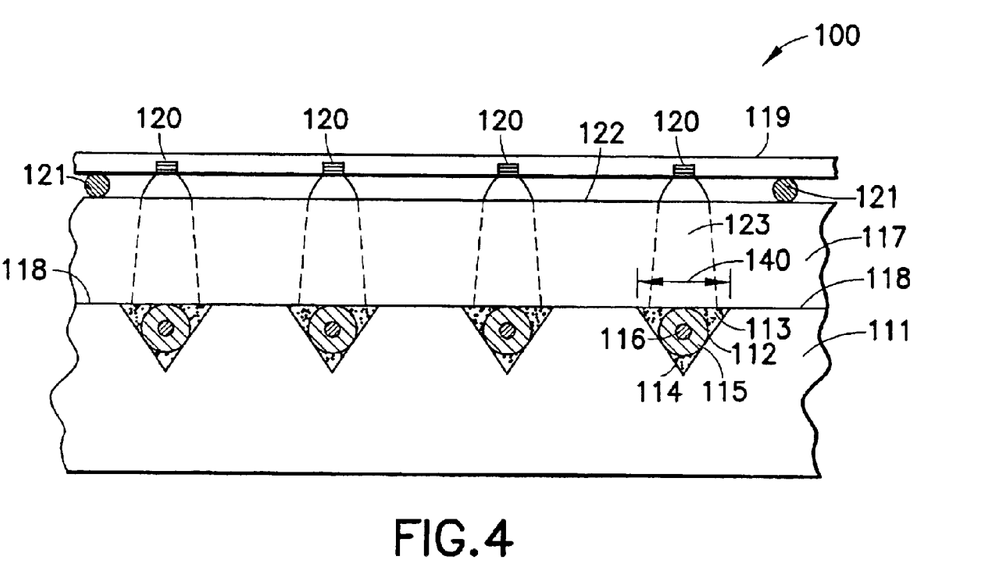

FIG. 4 is a schematic representation of an array of optical/optoelectronic coupling structures of the invention, each, for example, as shown in FIGS. 1, 3, 6 or 8, showing the optical fibers end-on. Light-emitting devices 120 formed in suitable substrate 119 are in electrical communication with bump bonds 121, which are in turn in electrical communication with CMOS circuitry in a thin silicon layer formed on top surface 122 of transparent, insulating substrate 117, which has a bottom surface 118. Surface 118 is bonded to V-groove carrier substrate 111, which has V-grooves of width dimension 140 and inner surfaces 112 to receive optical fibers 115. The optical fibers 115 have cores 116 and outer surfaces 114. The optical fibers are immobilized in the V-grooves by an adhesive which fills areas 113 around the fibers. The adhesive is selected as described above. The optical fibers are positioned in the V-grooves so that light emitted by the optoelectronic devices 120 is transmitted on pathways 123, through transparent substrate 117. The light impinges on optical fiber cores 116 and is reflected and launched into the cores by a light-reflective angled structure, for example, beveled light-reflective ends of the optical fiber cores, with a reflective coating optionally deposited thereon (by analogy to FIG. 2). The adhesive is selected as described above. By such means arrays of optoelectronic devices, for example, VCSELs and photodetectors, may be usefully incorporated into optical networks.

Figure 5:
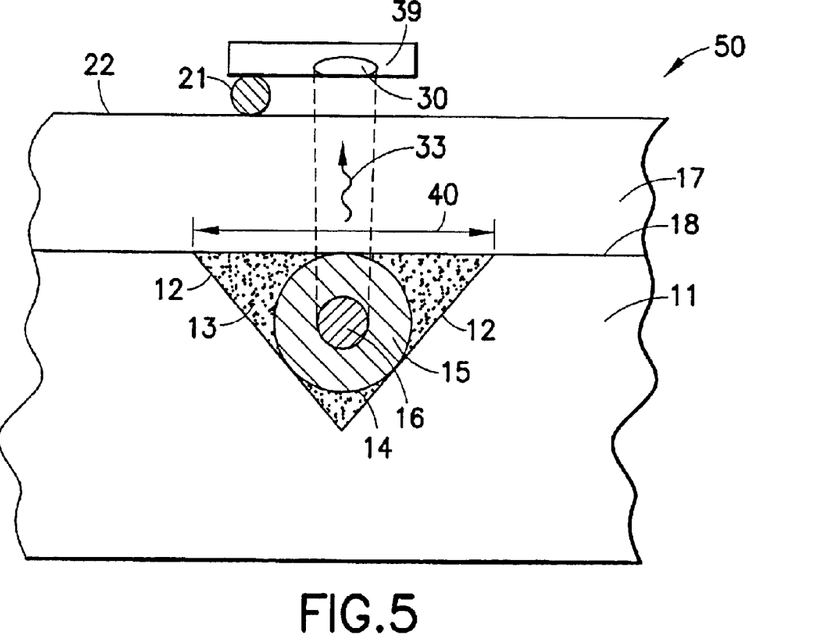
Figure 6:
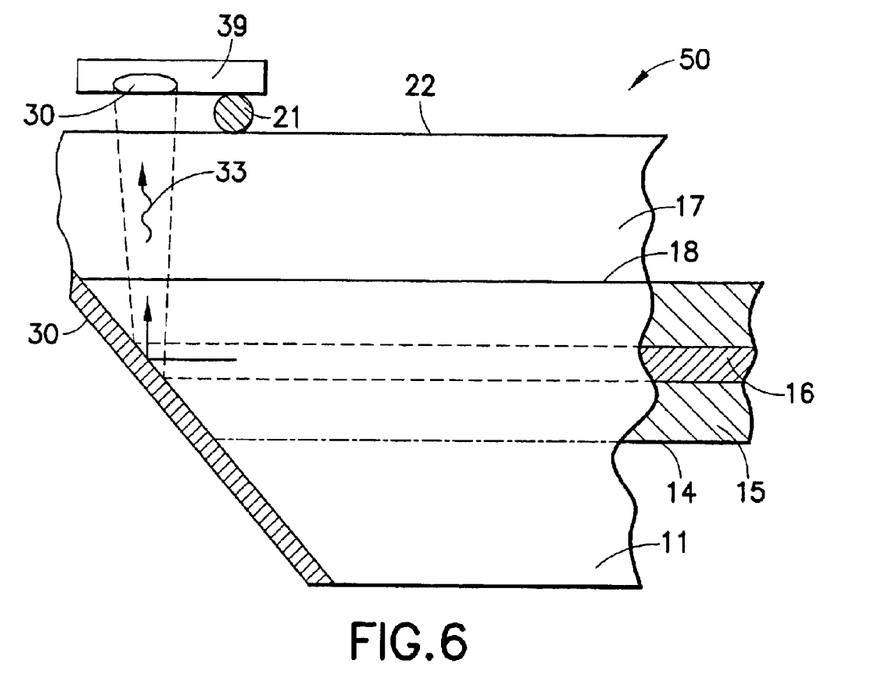

FIG. 5 (end-on) and FIG. 6 (side-on) are schematic representations of an optical/optoelectronic coupling structure of the invention, wherein the optoelectronic device 30 is a light receiving device such as a photodetector fabricated in suitable substrate 39. The light receiving device 30 is in electrical communication with bump bond 21, which is in turn in electrical communication with CMOS circuitry in a thin silicon layer (not shown) formed on top surface 22 of transparent, insulating substrate 17, which has a bottom surface 18. Surface 18 is bonded to V-groove carrier 11, which has a V-groove of width dimension 40 and inner surfaces 12 to receive optical fiber 15. The optical fiber 15 has core 16 and outer surface 14. The optical fiber is immobilized in the V-groove by an adhesive which fills area 13 around the fiber. The adhesive is selected as described above. The optical fiber is positioned the V-groove so that light emitted by the fiber optic core impinges on beveled end surface 34 of the core, is reflected by end surface 34 or optional reflective coating 30 deposited thereon, and is launched on pathway 33 through transparent substrate 17 to impinge on light receiving device 30. The adhesive is selected as described above. By analogy with the array shown in FIG. 4, arrays of light-receiving devices, for example photodetectors, may be usefully incorporated into optical networks.

Figure 7:
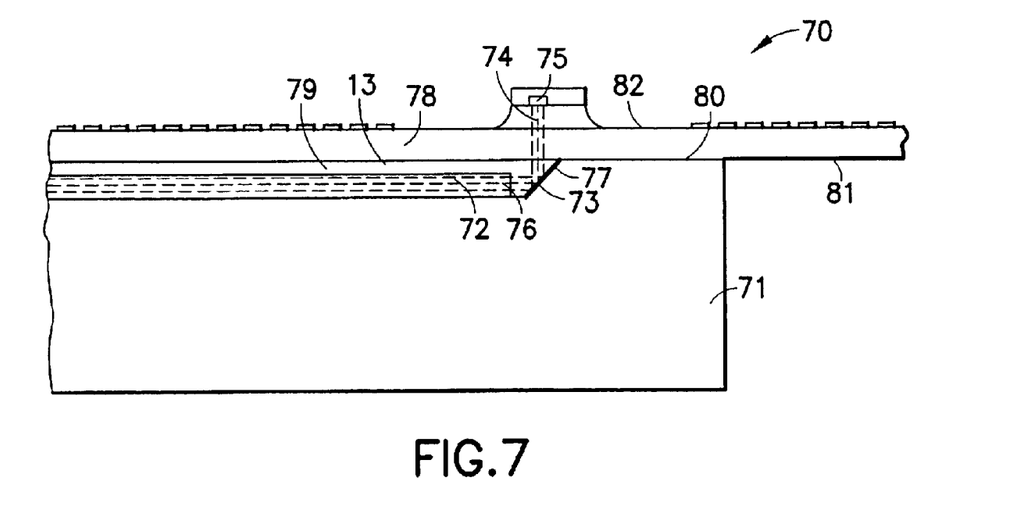
FIG. 7 is a side-view schematic representation of an optical/optoelectronic coupling structure employing a beveled-end fiber carrier.

FIG. 7 is a side-view schematic representation of an optical/optoelectronic coupling structure 70 employing a beveled-end fiber carrier 71. Optical fiber carrier 71 carries one or more optical fibers 72 held longitudinally in a recessed area(s) 79. Optical fiber carrier 71 may be a molded or etched V-groove structure. Transparent insulating substrate 78 is mounted through its bottom surface 81 to the top surface 80 of structure 71. An optoelectronic device 75 is flip-chip bonded to the top surface 82 of substrate 75, as described above. The recessed fiber-retaining areas of fiber carrier 71 are each terminated with an end-surface 73 angled to reflect light such that an optical path 74 is described between the optoelectronic device 75 and the optical fiber core 76 by way of the light-reflective beveled end surface 73. End-surface 73 may optionally be provided with a reflective coating 77 to enhance its reflectivity. An adhesive, selected as described above, fills all or part of area 13 around the fiber.

Figure 8:
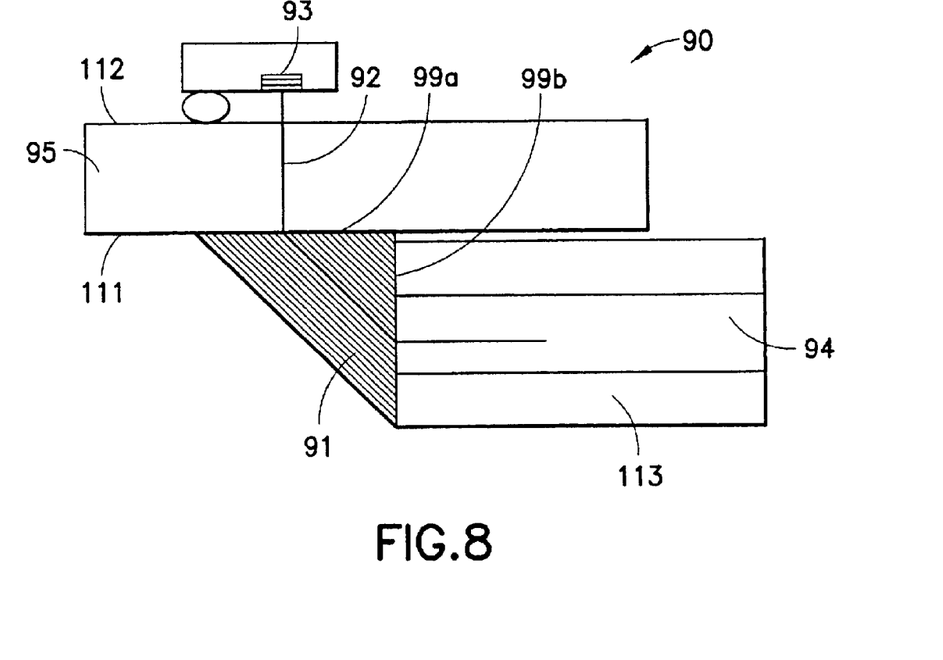
FIG. 8 shows a side-view schematic representation of an optical/optoelectronic coupling structure which employs a fiber image guide to define an optical pathway between an optoelectronic device and an optical fiber core.

FIG. 8 shows a side-view schematic representation of an optical/optoelectronic coupling structure 90 which employs a fiber image guide 91 polished on two surfaces 99a and 99b normal to each other, to define an optical pathway 92 between an optoelectronic device 93 and an optical fiber core 94. Transparent insulating substrate 95 is mounted through its bottom surface 111 to the top surface of a suitable optical fiber carrier (not shown) in which optical fiber 113 is mounted, e.g., as described earlier. The optoelectronic device 93 is flip-chip bonded to top surface 112 of transparent insulating substrate 95 as described above.

Use of a fiber image guide may be advantageous in higher temperature applications or where a small physical form factor is required. The glass fiber image guide is not very susceptible to heat damage and has a smaller coefficient of thermal expansion than plastic (thus it can maintain alignment over a larger temperature range). Secondly, the coupling structures can be very thin, since a V-groove support structure is not required. The fiber image guide and fibers can be directly mounted on the sapphire substrate resulting in a total thickness of the fiber cladding diameter (typically 125 $\mu$m).

Figure 9:
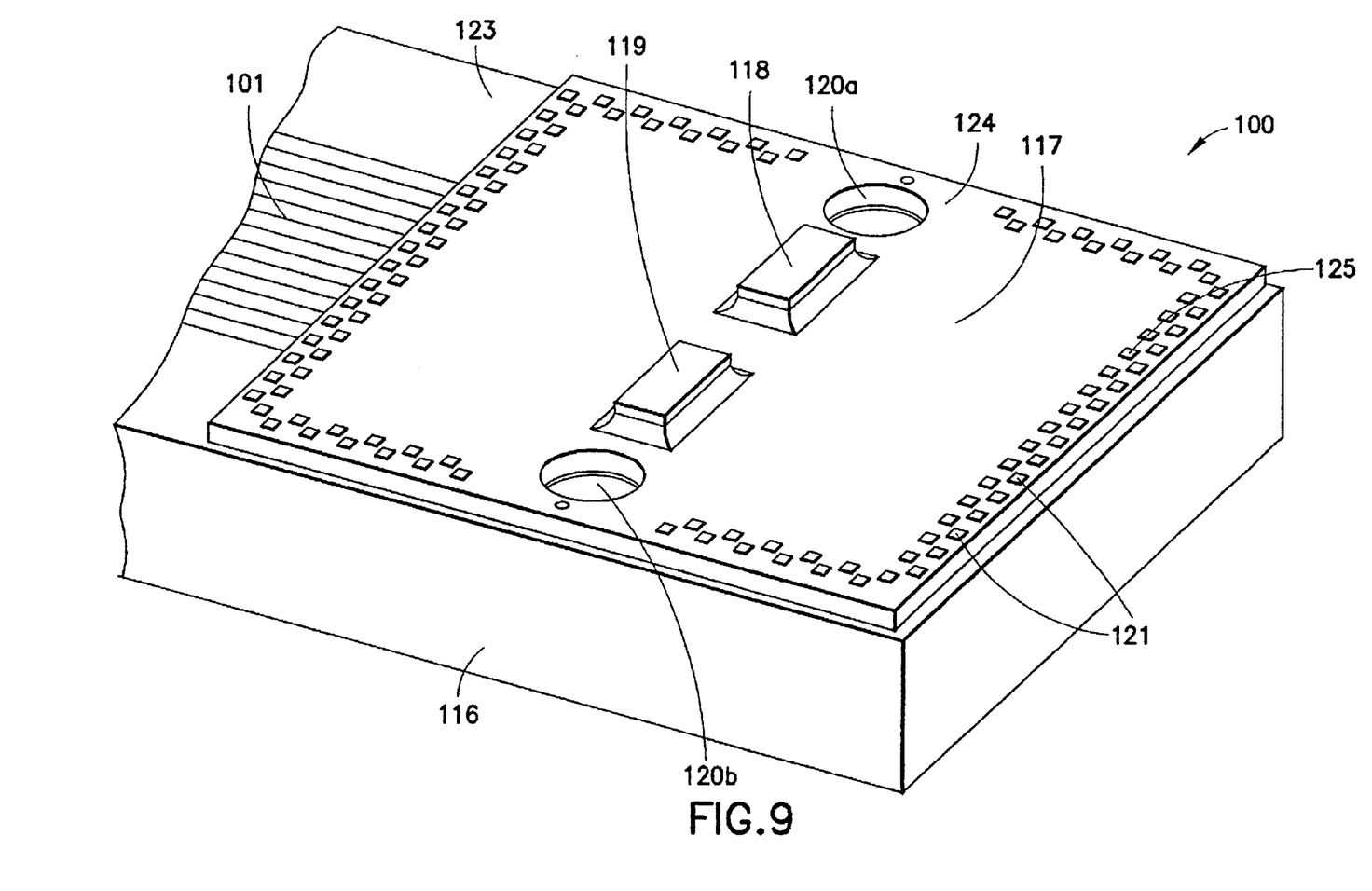
FIG. 9 is a top-view schematic representation of an optical/optoelectronic coupling structure of the invention, configured to accept a 1×12 array of optical fibers, couple them to optoelectronic devices, and provide electrical connections to external circuits.

FIG. 9 is a top-view schematic representation of an optical/optoelectronic coupling structure 100, configured to accept a 1×12 array of optical fibers 101 held in a precisely spaced-apart arrangement in an optical fiber carrier 116. The angled optical pathway can be formed by any of the methods shown in FIGS. 1–8, e.g., a light-reflective angled surface, a fiber image guide, or other suitable light-angling means. Transparent insulating substrate 117 is attached to top surface 123 of the optical fiber carrier as described earlier. Optoelectronic device arrays 118 and 119 are attached to top surface 124 of the transparent insulating substrate by flip-chip bonding. Optoelectronic device arrays 118 and 119 are oriented so that light access to the optoelectronic devices is provided through substrate 117. Electronic circuitry present in a thin silicon layer on selected areas of surface 124 (not shown) is in electrical communication with the optoelectronic devices through electrically conductive flip-chip bonds and with numerous conductive bonding pads 121 whose function is to provide electrical connection to other circuits, for example, power supply, on external printed circuit boards. Transparent substrate 117 may be provided with guideholes 120a and 120b positioned to provide attachment and passive alignment by means of guide pins, to other connectors.

In one embodiment, optoelectronic device arrays 118 and 119 may be a photodetector array and a VCSEL array respectively, and structure 100 functions as a light signal transceiver.

It will be understood that the optical-optoelectronic coupling structures of the present invention may be employed with many dimensions and designs typical of such devices. Thus, there are numerous other embodiments of the invention which will be obvious to one skilled in the art, including but not limited to changes in the dimensions of the regions forming the devices, the type of processes used to fabricate devices, the specific circuit designs, etc. Additionally, one skilled in the art will realize that the apparatus and method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical-optoelectronic coupling structure comprising:
  a flip-chip optoelectronic/silicon-on-insulator module comprising (a) a transparent insulating substrate having a top surface and a bottom surface, (b) an optoelectronic device flip-chip bonded to the top surface of said transparent insulating substrate, and (c) a controlling electrical circuitry formed in a silicon layer on a selected area of the top surface of said transparent insulating substrate, wherein the optoelectronic device is directly flip-chip bonded to the controlling electrical circuitry;
  an optical fiber carrier attached to the bottom surface of the transparent insulating substrate;
  an optical fiber oriented in the optical fiber carrier with its long axis at an angle to the primary direction of light that is emitted or absorbed by the optoelectronic device; and
  a light-reflective angled structure by means of which an optical path is described between the optoelectronic device and the optical fiber, wherein the optical path passes through the transparent insulating substrate.

2. An optical-optoelectronic coupling structure according to claim 1, wherein the optoelectronic device is selected a group including lasers, light-emitting diodes, photodetectors, and light modulators.

3. An optical-optoelectronic coupling structure according to claim 1, wherein the optical fiber carrier is a V-groove carrier.

4. An optical-optoelectronic coupling structure according to claim 1, wherein the light-reflective angled structure comprises a light-reflective beveled end-surface of the optical fiber.

5. An optical-optoelectronic coupling structure according to claim 4, wherein the light-reflective beveled end-surface is coated with a light-reflective material.

6. An optical-optoelectronic coupling structure according to claim 1, wherein a lens structure is included in the optical path.

7. An optical-optoelectronic coupling structure according to claim 3, wherein the light-reflective angled structure comprises a light-reflective beveled interior surface within the V-groove carrier.

8. An optical-optoelectronic coupling structure according to claim 7, wherein the light-reflective beveled interior surface is coated with a light-reflective material.

9. An optical-optoelectronic coupling structure according to claim 8, wherein a lens structure is included in the optical path.

10. An optical-optoelectronic coupling structure according to claim 1, wherein the optical fiber comprises an outer cladding and is immobilized in the optical fiber carrier by an adhesive, wherein said adhesive is characterized by a refractive index substantially similar to the refractive index of the outer cladding of the optical fiber.

11. An optical-optoelectronic coupling structure, according to claim 1, wherein the transparent insulating substrate of the flip-chip optoelectronic/silicon-on-insulator module comprises sapphire.

12. An optical-optoelectronic coupling structure according to claim 1, wherein:

the flip-chip optoelectronic/silicon-on-insulator module includes two or more optoelectronic devices in a spaced-apart arrangement;

the optical fiber carrier retains two or more optical fibers in a corresponding spaced-apart arrangement, each of said fibers having a long axis which forms an angle to the primary direction of light emission or absorption by the optoelectronic devices; and the optical-optoelectronic coupling structure comprises one or more light-reflective angled structures by means of which optical paths are described between the two or more optoelectronic devices and the corresponding two or more optical fibers, said paths passing through the transparent insulating substrate.

13. An optical-optoelectronic coupling structure according to claim 12, wherein the optoelectronic devices are independently selected from the group consisting of lasers, light-emitting diodes, photodetectors, and light modulators.

14. An optical-optoelectronic coupling structure according to claim 12, wherein the optical fiber carrier is a V-groove carrier.

15. An optical-optoelectronic coupling structure according to claim 12, wherein the light-reflective angled structure comprises a light-reflective beveled end-surface of the optical fiber.

16. An optical-optoelectronic coupling structure according to claim 12, wherein lens structures are included in the optical paths.

17. An optical-optoelectronic coupling structure according to claim 12, wherein the light-reflective angled structure comprises a light-reflective beveled interior surface within the V-groove carrier.

18. An optical-optoelectronic coupling structure according to claim 17, wherein the light-reflective beveled interior surface is coated with a light-reflective material.

19. An optical-optoelectronic coupling structure according to claim 12, wherein the optical fiber comprises an outer cladding and is immobilized in the optical fiber carrier by an adhesive, wherein said adhesive is characterized by a refractive index substantially similar to the refractive index of the outer cladding of the optical fiber.

20. An optical-optoelectronic coupling structure according to claim 12, wherein the transparent insulating substrate of the flip-chip optoelectronic/silicon-on-insulator module comprises sapphire.

21. An optical-optoelectronic coupling structure according to claim 12, wherein the optoelectronic devices comprise one or more photodetectors and one or more VCSELs.

22. A light transceiver comprising (i) a structure for coupling light emitted by one or more optical fibers into the active areas of one or more corresponding photodetectors for signal reception; (ii) a structure for coupling light emitted by one or more VCSELs into one or more corresponding optical fibers for signal transmission; (iii) a common transparent insulating substrate to which the one or more photodetectors and the one or more VCSELs are both flip-chip bonded; and (iv) CMOS electrical circuitry formed in a thin silicon layer on the transparent, insulating substrate and in electrical communication with the one or more photodetectors and the one or more VCSELs; wherein said light transceiver comprises an optical/optoelectronic coupling structure according to claim 1.

23. An optical-optoelectronic coupling structure comprising:

a flip-chip optoelectronic/silicon-on-insulator module comprising (a) a transparent insulating substrate having a top surface and a bottom surface, (b) an optoelectronic device flip-chip bonded to a top surface of a transparent insulating substrate, and (c) a controlling electrical circuitry formed in a silicon layer on a selected area of the top surface of said transparent insulating substrate, wherein the optoelectronic device is directly flip-chip bonded to the controlling electrical circuitry;

an optical fiber adjacent to a bottom surface of the transparent insulating substrate with its long axis at a first angle to the primary direction of light that is emitted or absorbed by the optoelectronic device; and a fiber image guide, polished on two surfaces cut at a second angle to each other by means of which an optical path is described between the optoelectronic device and the optical fiber through the transparent insulating substrate.

24. A method for fabricating an optical-optoelectronic coupling structure comprising the steps of:

providing a flip-chip optoelectronic/silicon-on-insulator module comprising (a) a transparent insulating substrate having a top surface and a bottom surface, (b) one or more optoelectronic devices flip-chip bonded to the top surface of said transparent insulating substrate, and (c) one or more corresponding controlling electrical circuitries formed in a silicon layer on selected areas of the top surface of said transparent insulating substrate, wherein the optoelectronic devices are each directly flip-chip bonded to the corresponding controlling electrical circuitries;

attaching the bottom surface of the transparent insulating substrate of said flip-chip optoelectronic/silicon-on-insulator module to the top surface of an optical fiber carrier comprising one or more optical fibers in such manner that the long axes of the optical fibers are at an angle to the primary direction of light that is emitted or absorbed by the optoelectronic devices of the flip-chip optoelectronic/silicon-on-insulator module; and providing a light-reflective angled structure by means of which optical paths are described between the optoelectronic devices and the optical fibers through the transparent insulating substrate.

25. A method according to claim 24, wherein the transparent insulating substrate comprises sapphire.

26. A method for making an optical-optoelectronic coupling structure according to claim 24, wherein the optical fiber carrier is a V-groove optical fiber carrier.

27. A method for making an optical-optoelectronic coupling structure according to claim 24, further comprising providing lens structures in the optical paths between the optical fibers and the optoelectronic devices.

28. A method for making an optical-optoelectronic coupling structure according to claim 26, wherein the optical fibers comprise an outer cladding and further comprising the step of immobilizing the optical fibers in the V-groove carrier with a curable resin adhesive characterized by a refractive index substantially similar to a refractive index of an outer cladding layer of the optical fibers.

29. A method for making an optical-optoelectronic coupling structure according to claim 26, further comprising the steps of:
   (a) forming light-reflective beveled end-surfaces on the optical fibers; and
   (b) positioning the optical fibers within the V-groove such that by means of the light-reflective beveled end-surfaces optical paths are described between the optoelectronic devices and the optical fibers passing through the transparent insulating substrate.

30. A method for making an optical-optoelectronic coupling structure according to claim 26, further comprising the steps of:
   (a) forming in the V-groove optical fiber carrier a light-reflective beveled interior surface; and
   (b) positioning the V-groove optical fiber carrier such that by means of the light-reflective beveled interior surface optical paths are described between the optoelectronic devices and the optical fibers passing through the transparent insulating substrate.

31. A method for making an optical-optoelectronic coupling structure according to claim 30, further comprising coating the light-reflective beveled interior surface of the optical fiber carrier with a light-reflective material.

32. A method for fabricating an optical-optoelectronic coupling structure comprising the steps of:

providing a flip-chip optoelectronic/silicon-on-insulator module comprising (a) a transparent insulating substrate having a top surface and a bottom surface, (b) one or more optoelectronic devices flip-chip bonded to the top surface of said transparent insulating substrate, and (c) one or more corresponding controlling electrical circuitries formed in a silicon layer on selected areas of the top surface of said transparent insulating substrate, wherein the optoelectronic devices are each directly flip-chip bonded to the corresponding controlling electrical circuitries;

attaching the bottom surface of the transparent insulating substrate of said flip-chip optoelectronic/silicon-on-insulator module to one or more optical fibers which are oriented with the long axes of said optical fibers at an angle to the primary direction of light that is emitted or absorbed by the optoelectronic devices; and mounting a fiber image guide, polished on two surfaces cut at an appropriate angle to each other, between the optical fibers and the transparent insulating substrate, such that by means of the fiber image guide, optical paths are described between the optoelectronic devices and the optical fibers, wherein the optical paths pass through the transparent insulating substrate.

33. A method for making an optical-optoelectronic coupling structure according to claim 32, wherein the flip-chip optoelectronic/silicon-on-insulator module comprises one or more photodetectors and one or more VCSELs.

* * * * *